US008593779B2

(12) United States Patent
Sogard (10) Patent No.: US 8,593,779 B2
(45) Date of Patent: Nov. 26, 2013

(54) HYBRID ELECTROSTATIC CHUCK

(75) Inventor: Michael R. Sogard, Menlo Park, CA (US)

(73) Assignee: Nikon Corporation, Tokyo (JP)

(*) Notice: Subject to any disclaimer, the term of this patent is extended or adjusted under 35 U.S.C. 154(b) by 511 days.

(21) Appl. No.: 12/652,669

(22) Filed: Jan. 5, 2010

(65) Prior Publication Data

US 2011/0164343 A1  Jul. 7, 2011

(51) Int. Cl.
*H01L 21/683* (2006.01)
(52) U.S. Cl.
USPC .......................................................... 361/234
(58) Field of Classification Search
USPC .......................................................... 361/234
See application file for complete search history.

(56) References Cited

U.S. PATENT DOCUMENTS

| | | | |
|---|---|---|---|
| 5,207,437 A | 5/1993 | Keller et al. | |
| 5,841,624 A | 11/1998 | Xu | |
| 5,880,992 A | 3/1999 | Husein | |
| 5,903,428 A | 5/1999 | Grimard et al. | |
| 6,522,519 B1 | 2/2003 | Hirayanagi | |
| 6,754,062 B2 | 6/2004 | Logan et al. | |
| 7,042,697 B2 | 5/2006 | Tsuruta et al. | |
| 7,352,554 B2 | 4/2008 | Lagos | |
| 2002/0017616 A1* | 2/2002 | Ota | 250/492.1 |
| 2004/0067420 A1 | 4/2004 | Ota | |

FOREIGN PATENT DOCUMENTS

WO       WO03003449       1/2003

OTHER PUBLICATIONS

M.R. Sogard, Nikon Research Corp. of America, A.R. Mikkelson, et al., Computational Mechanics Center, University of Wisconsin, Analysis of Coulomb and Johnsen-Rahbek Electrostatic Chuck Performance for EUV Lithography, JVST B Paper 323, published Dec. 7, 2007, © 2007 American Vacuum Society.

Mitsuaki Amemiya et al.,"Experimental Study of Particle-free Mask Handling," Alternative Lithographic Technologies, © 2009 SPIE, Proc. of SPIE vol. 7271 72713G-1, MIRAI-Semiconductor Leading Edge Technologies, Inc. Japan.

(Continued)

*Primary Examiner* — Rexford Barnie
(74) *Attorney, Agent, or Firm* — Roeder & Broder LLP (57) ABSTRACT

An electrostatic chuck (230) for holding a device (200) includes a chuck body (244), a Coulomb electrode assembly (246), a Johnsen-Rahbek (J-R) electrode assembly (248), and a control system (224). The chuck body (244) includes a chucking surface (250) that engages the device (200), and the chuck body (244) is made of a dielectric having a relatively high resistance. The J-R electrode assembly (248) is positioned spaced apart from the chucking surface (250). The Coulomb electrode assembly (246) is also positioned spaced apart from the chucking surface (250). The control system (224) selectively directs a first voltage to the J-R electrode assembly (248) to generate a J-R type force that attracts the device (200) towards the chucking surface (250), and selectively directs a second voltage to the Coulomb electrode assembly (246) to generate a Coulomb type force that also attracts the device (200) towards the chucking surface (250). With this design, both the J-R type force and the Coulomb type force are used to concurrently attract the device (200) against the chucking surface (2500. As a result thereof, the electrostatic chuck (230) is better able to reduce non-flatness of the device (200), and/or crush any particles positioned between the device (200) and the chucking surface (250).

18 Claims, 9 Drawing Sheets

(56) References Cited

OTHER PUBLICATIONS

SEMI® (Semiconductor Equipment and Materials International), Specification for Extreme Ultraviolet Lithography Mask Substrates, SEMI P37-1101, ©SEMI 2001, San Jose, CA 95134.

SEMI® (Semiconductor Equipment and Materials International), Specification for Mounting Requirements and Alignment Reference Locations for Extreme Ultraviolet Lithography Masks, SEMI P40-1103, ©SEMIi 2003, San Jose, CA 95134.

Larry D. Hartsough, Electrostatic Wafer Holding, Contamination Control, Jan. 1993, vol. 35, Solid State Technology, US.

D.R. Wright et al., Manufacturing issues of electrostatic chucks, Jul./Aug. 1995, J. Vac. Sci. Technol. B 13(4) © 1995 American Vacuum Society, US.

Toshiya Watanabe, Relationship between Electrical Resistivity and Electrostatic Force of Alumina Electrostatic Chuck, Part 1, No. 2, Feb. 1993, Jpn. J. Appl. Phys. vol. 32, Japan.

B.B. Levchenko, On parameterizations of the Nordheim function, Dec. 20, 2005, arXiv:cond-mat/0512513 v1, Institute of Nuclear Physics, Moscow State Univ., Moscow, 119992 Russia.

H.B. Chan, et al., Quantum Mechanical Actuation of Microelectomechanical Systems by the Casimir Force, Mar. 9, 2001, Science, vol. 291, www.sciencemag.org.

Notification Concerning Transmittal of International Preliminary Report on Patentability and Written Opinion of the International Searching Authority for International Application No. PCT/US10/73898 of Nikon Corporation, Jul. 19, 2012, Geneva, Switzerland (related to present application).

* cited by examiner

HYBRID ELECTROSTATIC CHUCK

BACKGROUND

Exposure apparatuses for semiconductor processing are commonly used to transfer images from a reticle onto a semiconductor wafer during semiconductor processing. A typical exposure apparatus includes an illumination source, a reticle stage assembly that holds and positions a reticle, an optical assembly, and a wafer stage assembly that holds and positions a semiconductor wafer.

Recently, extreme ultraviolet lithography ("EUVL") systems that use an extreme ultraviolet illumination source have been proposed to increase the number of transistors transferred to the wafer. The extreme ultraviolet light must travel in a vacuum to avoid the absorption of the extreme ultraviolet light.

The reticle in these systems is a reflective type and requires the use of an electrostatic chuck to both support the reticle, and flatten any unevenness in the reticle. Further, any particles positioned between the reticle and the chuck can cause additional unevenness in the chucked reticle. Current EUVL standards specify that the chucked reticle has a surface flatness not to exceed less than fifty nanometers peak-to-valley.

Unfortunately, existing electrostatic chucks may not generate sufficient force to sufficiently flatten particles occurring between the reticle and the chuck.

SUMMARY

The present invention is directed at an electrostatic chuck for holding a device. The electrostatic chuck includes a chuck body, a Coulomb electrode assembly, a Johnsen-Rahbek (or J-R) electrode assembly, and a control system. The chuck body includes a chucking surface that engages the device, and the chucking surface is made of a dielectric having a relatively high resistance. The J-R electrode assembly is positioned spaced apart from the chucking surface. The Coulomb electrode assembly is also positioned spaced apart from the chucking surface.

As provided herein, the control system selectively directs a first voltage to the Coulomb electrode assembly to generate a Coulomb type force that attracts the device towards the chucking surface, and selectively directs a second voltage to the J-R electrode assembly to generate a J-R type force that clamps the device to the chucking surface. With this design, both the J-R type force and the Coulomb type force are used to concurrently attract the device against the chucking surface. As a result thereof, the electrostatic chuck is better able to reduce non-flatness of the device, and/or crush or flatten any particles positioned between the device and the chuck. Thus, the electrostatic chuck can be used in an exposure apparatus to manufacture higher quality, and higher density wafers.

In one embodiment, the chucking surface is substantially uniform (homogeneous) in composition. As a result thereof, the chucking surface can be made with tighter tolerances and the chucking surface will expand and contract at the same rate. An accurately manufactured chucking surface is critical to retaining the device in a flattened condition.

In certain embodiments, the Coulomb electrode assembly is closer to the chucking surface than the J-R electrode assembly. As provided herein, an electrode gap separates the Coulomb electrode assembly from the chucking surface. For example, the electrode gap can be less than approximately 100 μm.

In another embodiment, the present invention is directed to an exposure apparatus comprising an illumination source in addition to the electrostatic chuck. Further, the control system directs the first voltage to the Coulomb electrode assembly and the second voltage to the J-R electrode assembly during initial chucking of the device. Subsequently, the control system does not direct the first voltage to the Coulomb electrode assembly during operation of the illumination source (e.g. during the exposure process). Thus, only the J-R electrode assembly is utilized to retain the device after initial chucking. Because, the Coulomb electrode assembly is not used during the exposure process, the power required to operate the chuck is reduced and the heat generated by the chuck is reduced.

The present invention is also directed to a method for holding a device. The method can include the steps of: (i) providing a chuck body having a chucking surface that engages the device, the chucking surface being made of a dielectric having a relatively high resistance; (ii) providing a J-R electrode assembly spaced apart from the chucking surface; (iii) providing a Coulomb electrode assembly spaced apart from the chucking surface; (iv) selectively directing a first voltage to the Coulomb electrode assembly with a control system to generate a Coulomb type force that attracts the device towards the chucking surface; and (v) selectively directing a second voltage to the J-R electrode assembly to generate a J-R type force that clamps the device to the chucking surface.

Further, the present invention is also directed to a wafer, and a method for manufacturing an object on a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
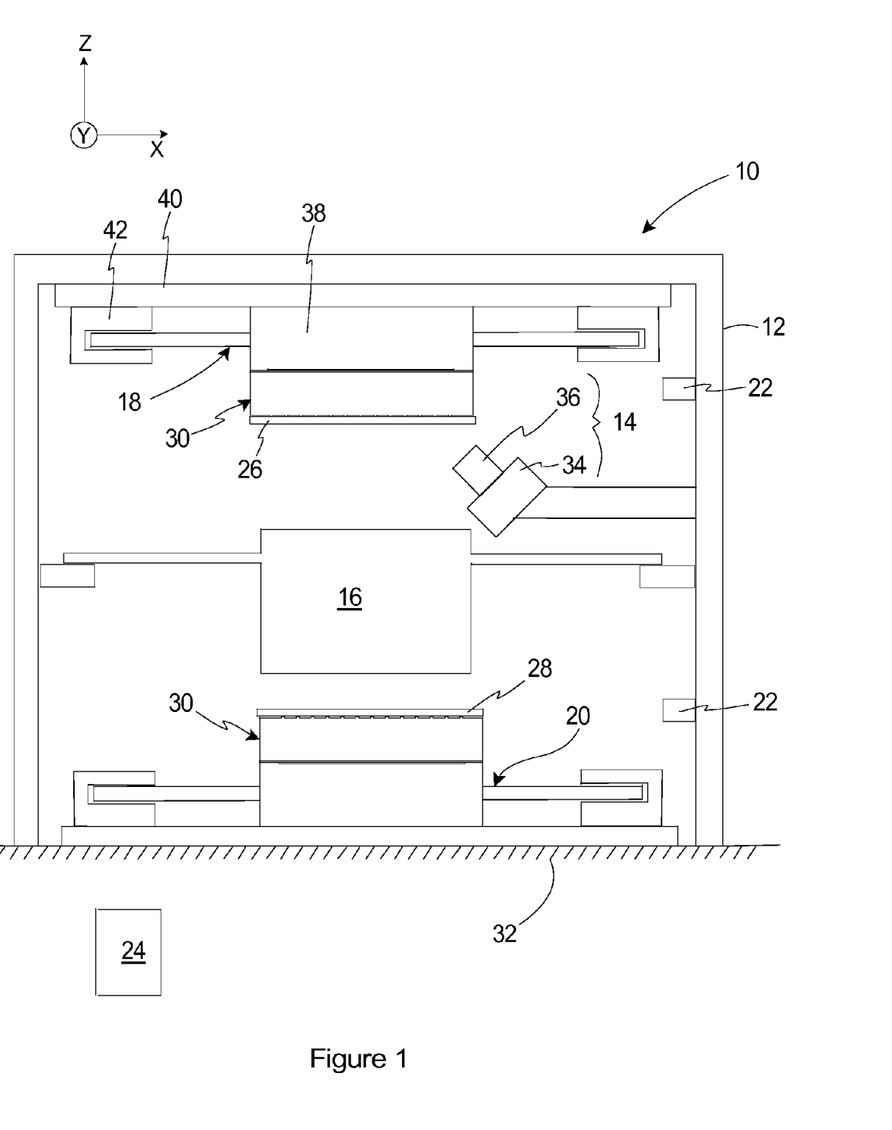
FIG. 1 is a schematic illustration of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a measurement system 22, and a control system 24. The design of the components of the exposure apparatus 10 can be varied to suit the design requirements of the exposure apparatus 10.

A number of Figures include an orientation system that illustrates an X axis, a Y axis that is orthogonal to the X axis and a Z axis that is orthogonal to the X and Y axes. It should be noted that these axes can also be referred to as the first, second and third axes.

The exposure apparatus 10 is particularly useful as a lithographic device that transfers a pattern (not shown) of an integrated circuit from a reticle 26 onto a semiconductor wafer 28.

As an overview, in certain embodiments, the reticle stage assembly 18 includes a hybrid electrostatic chuck 30 that retains the reticle 26 in a repeatable fashion and with improved flatness. Alternatively, or additionally, the wafer stage assembly 20 can include a hybrid electrostatic chuck 30 that retains the wafer 28 in a repeatable fashion and with improved flatness. This allows the exposure apparatus 10 to manufacture higher quality, higher density wafers 28.

There are a number of different types of lithographic devices. For example, the exposure apparatus 10 can be used as a scanning type photolithography system. Alternatively, the exposure apparatus 10 can be a step-and-repeat type photolithography system. However, the use of the exposure apparatus 10 provided herein is not limited to a photolithography system for semiconductor manufacturing.

The apparatus frame 12 is rigid and supports the components of the exposure apparatus 10. The apparatus frame 12 illustrated in FIG. 1 supports the reticle stage assembly 18, the optical assembly 16 and the illumination system 14 above a mounting base 32, e.g., the ground, a base, or floor or some other supporting structure.

The illumination system 14 includes an illumination source 34 and an illumination optical assembly 36. The illumination source 34 emits a beam (irradiation) of light energy. The illumination optical assembly 36 guides the beam of light energy from the illumination source 34 to the reticle 26. The beam illuminates selectively different portions of the reticle 26 and exposes the wafer 28. In FIG. 1, the reticle 26 is reflective and the energy beam is directed from below the reticle 26.

The electrostatic chuck 30 is particularly useful in extreme ultraviolet lithography (EUVL) systems that require that the optical path for the beams be in a vacuum. In an EUVL system, the illumination source 34 is an extreme ultraviolet illumination system that generates light having a wavelength of approximately 13 nanometers. Alternatively, the chuck 30 can be used in lithography systems other than EUVL systems. As examples of alternative embodiments, the illumination source 34 can be a g-line source (436 nm), an i-line source (365 nm), a KrF excimer laser (248 nm), an ArF excimer laser (193 nm) or a $F_2$ laser (157 nm). In these alternative embodiments the hybrid chuck is restricted to use with the substrate to be patterned, since the reticles employed by them are transmissive rather than reflective.

For an EUVL system, the elements of the illumination optical assembly 36 are reflective. Alternatively, for non-EUVL systems, the elements of the illumination optical assembly 36 can be lenses.

The optical assembly 16 projects and/or focuses the light from the reticle 26 to the wafer 28. For an EUVL system, the elements of the optical assembly 16 are reflective. Alternatively, for non-EUVL systems, the elements of the optical assembly 16 can be lenses.

The reticle stage assembly 18 holds and positions the reticle 26 relative to the optical assembly 16 and the wafer 28. Somewhat similarly, the wafer stage assembly 20 holds and positions the wafer 28 with respect to the projected image of the illuminated portions of the reticle 26. The design of each stage assembly 18, 20 can vary pursuant to the teaching provided herein. In one embodiment, each stage assembly 18, 20 includes the chuck 30, a stage 38 that retains the chuck 30, a stage base 40 that guides the movement of the stage 38, and a stage mover assembly 42 that moves the chuck 30 and the device retained by the chuck 30. The size, shape, and design of each these components can be varied to suit the movement requirements of the exposure apparatus 10.

The measurement system 22 monitors movement of the reticle 26 and the wafer 28 relative to the optical assembly 16 or some other reference. With this information, the control system 24 can control the reticle stage assembly 18 to precisely position the reticle 26 and the wafer stage assembly 20 to precisely position the wafer 28. For example, the measurement system 22 can utilize multiple laser interferometers, encoders, and/or other measuring devices.

The control system 24 is connected to the reticle stage assembly 18, the wafer stage assembly 20, and the measurement system 22. The control system 24 receives information from the measurement system 22 and controls the stage mover assemblies 18, 20 to precisely position the reticle 26 and the wafer 28. Further, the control system 24 directs voltage to the chucks 30 to control the activation and deactivation of the chucks 30. The control system 24 can include one or more processors and circuits.

There are two conventional types of electrostatic chuck: Coulomb and Johnsen-Rahbek. These are distinguished by the characteristics of their dielectrics and the resulting mechanism of clamping force generation. The Coulomb chuck functions like a conventional dielectric capacitor, with a conducting back surface of the reticle serving as a second electrode. The Coulomb chuck generates attractive forces between the chuck and reticle which are relatively long range. The J-R dielectric has a large but finite resistance, so a current flows through it and the substrate when the surfaces are in contact and voltage is applied. Charge accumulates at the interface between substrate and dielectric. Since the thickness of the interface region is related to surface roughness, the charge separation is typically quite small, and strong electrostatic forces can be generated. The JR chuck force is essentially a contact force—if the two surfaces are not in contact, the force is almost zero. However, when the surfaces are close together, very strong attractive forces can be generated. In addition the voltages required for generating strong clamping pressures can be much less for the J-R chuck than the Coulomb chuck. Moreover the JR chuck is simpler and more robust than the Coulomb chuck. A comparative study of Coulomb and J-R chucks is given in M. Sogard et al, "Analysis of Coulomb and Johnsen-Rahbek Electrostatic Chuck Performance for EUV Lithography," J. Vac. Sci. Technol. B25, 2155 (2007), and as far as permitted, the contents of which are incorporated herein be reference.

Electrostatic chucks can have a single electrode or multiple electrodes. If a single voltage is applied to the chuck, the chuck is said to be monopolar; if voltages of opposite polarity are applied to multiple electrodes the chuck is said to be bipolar. The chuck surface can be either flat or covered with elevated projections or pins.

Figure 2A:
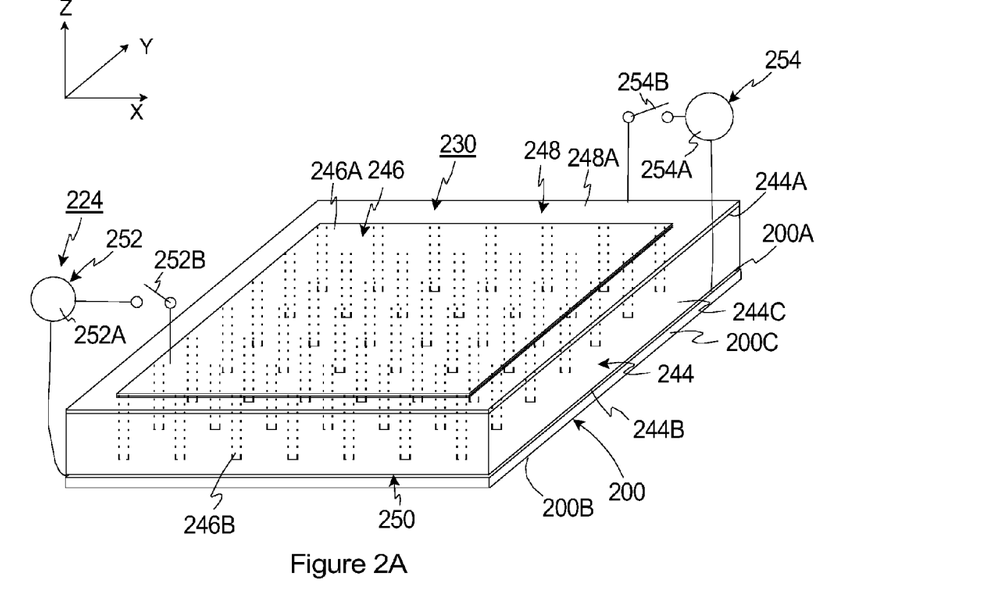
FIG. 2A is a perspective view of a device, a first embodiment of a chuck, and a simplified illustration of a portion of a control system having features of the present invention.

FIG. 2A is a perspective view of a device 200 (also sometimes referred to as a "work piece"), a first embodiment of a chuck 230, and a portion of the control system 224 having features of the present invention. For example, the device 200 can be the reticle 26 (illustrated in FIG. 1) and the chuck 230 securely retains the reticle 26. Alternatively, the device 200 can be the wafer 28 (illustrated in FIG. 1) and the chuck 230 can be used to securely retain the wafer 28. Still alternatively, the chuck 230 can be used to retain other types of device during manufacturing, inspection, and/or measurement operation.

In FIG. 2A, the device 200 is generally rectangular shaped (e.g. for a reticle 26) and includes a top 200A, a bottom 200B, and four sides 200C. Alternatively, the device 200 can have another configuration, such as generally circular disk shaped (e.g. for a wafer 28). In the embodiments disclosed herein, the top 200A of the device 200, or more generally the side facing the chuck, is electrically conductive.

In one embodiment, the chuck 230 includes a chuck body 244, a Coulomb electrode assembly 246, and a J-R electrode assembly 248 that cooperate to retain the device 200. The size, shape and design of these components can be varied to suit the chucking requirements of the device 200.

In FIG. 2A, the chuck body 244 is rigid, generally rectangular shaped, and includes a top, first surface 244A, and opposed bottom second surface 244B, and four sides 244C (only two are visible in FIG. 2A). Further, the chuck body 244 defines a chucking surface 250 that engages the device 200. In FIG. 2A, the chucking surface 250 is located at the bottom second surface 244B. Alternatively, the chuck body 244 can have a generally circular disk shaped configuration.

In one embodiment, the chuck body 244 is made of a dielectric material having a relatively high ("finite") resistance. Suitable materials for the chuck body 244 have a resistivity range of approximately $10^6$ to $10^{13}$ ohm-cm. Non-exclusive examples of suitable materials for the chuck body 244 include aluminum nitride, ceramic mixtures of alumina and titania, or silicon carbide.

The Coulomb electrode assembly 246 is used for generate a Coulomb type force that attracts the device 200 to the chucking surface 250. Stated in another fashion, the control system 224 selectively directs voltage to the Coulomb electrode assembly 246 to selectively generate the Coulomb type force that pulls the device 200 against the chucking surface 250. In FIG. 2A, the Coulomb electrode assembly 246 includes a Coulomb electrode plate 246A, and one or more spaced apart low resistivity channels 246B (illustrated in phantom).

In one embodiment, the Coulomb electrode plate 246A is generally rectangular shaped and is located on the top 244A of the chuck body 244. Alternatively, the Coulomb electrode plate 246A can be positioned at another location of the chuck body 244 and/or the Coulomb electrode plate 246A can have a configuration different than that illustrated in FIG. 2A. Suitable materials for the Coulomb electrode plate 246A include electrically conductive materials such as chrome, copper, or gold.

The low resistivity channels 246B provide a path for current directed to the Coulomb electrode plate 246A to flow to near the chucking surface 250. In addition, the low resistivity channels allow the voltage applied to the Coulomb electrode plate 246A to be transferred with little diminution to near the chucking surface. Because the voltage directed to the Coulomb electrode plate 246A is transferred to near the chucking surface 250, a significant Coulomb type force can be generated.

The number and design of the low resistivity channels 246B can be varied to suit the requirements of the chuck 230. In FIG. 2A, the chuck 230 includes forty-nine spaced apart low resistivity channels 246B that are organized in a seven by seven rectangular matrix. Alternatively, the chuck 230 can be design to include greater than forty-nine or fewer than forty-nine low resistivity channels 246B. The design of the low resistivity channels 246B is discussed in more detail below.

The J-R electrode assembly 248 is used to generate a J-R force that attracts the device 200 against the chucking surface 250. Stated in another fashion, the control system 224 directs voltage to the J-R electrode assembly 248 to generate the J-R type force that pulls the device 200 against the chucking surface 250. In FIG. 2A, the J-R electrode assembly 248 includes a J-R electrode plate 248A.

In one embodiment, the J-R electrode plate 248A is generally rectangular shaped and is located on the top 244A of the chuck body 244 below the Coulomb electrode plate 246A. Alternatively, the J-R electrode plate 248A can be positioned at another location of the chuck body 244 and/or the J-R electrode plate 248A can have a configuration different than that illustrated in FIG. 2A. Suitable materials for the J-R electrode plate 248A include electrically conductive materials such as chrome, copper, or gold.

The J-R electrode plate and the J-R dielectric also function analogously to the electrode and dielectric of a Coulomb chuck. Consequently, a J-R chuck also contributes a Coulomb type force, in addition to the J-R force. However, because the J-R dielectric is typically relatively thick, the J-R electrode is far from the substrate surface forming the second electrode of a dielectric capacitor, so the Coulomb force is quite weak and is often neglected in evaluating a J-R chuck.

The control system 224 (i) selectively and independently directs voltage to the Coulomb electrode assembly 246 to generate the Coulomb type force on the device 200, and (ii) selectively and independently directs voltage to the J-R electrode assembly 248 to generate the J-R type force on the device 200.

As provided herein, in certain embodiments, during initial chucking of the device, the control system 224 directs voltage to both the Coulomb electrode assembly 246 and the J-R electrode assembly 248 to generate both the Coulomb type force and the J-R type force to securely pull the device 200 against the chucking surface 250. As described in more detail below, because both the Coulomb type force and the J-R type force are used during initial chucking, the chuck 230 can securely pull the device 200 against the chucking surface 250 (i) to overcome/reduce any non-flatness of the device 200 and/or (ii) to crush any particles positioned between the chucking surface 250 and the device 200. As a result thereof, chuck 230 can be used to reduce non-flatness of the device 200, and the exposure apparatus 10 (illustrated in FIG. 1) can be used to manufacture higher quality, and higher feature density wafers 28 (illustrated in FIG. 1). More specifically, with EUVL systems 10, any non-flatness (i.e. variation of the height) of the pattern on the reticle 26 (illustrated in FIG. 1) results in image placement errors on the wafer 28. For this reason, it is imperative that the front side, and the back side of the reticle 26 is flat, as well as the chucking surface 250 being exceptionally flat.

Further, in certain embodiments, after the device 200 has been pulled flat against the chucking surface 250, the control system 224 can discontinue directing voltage to the Coulomb electrode assembly 246. As provided herein, after the device 200 is pulled flat against the chucking surface 250, the J-R force alone is sufficient to retain the device 200 flat against the chucking surface 250. Thus, voltage is not directed to the Coulomb electrode assembly 246 during the operation of the illumination system 12 (illustrated in FIG. 1) and during any transfer of features from the reticle 26 to the wafer 28. As a result thereof, power is reduced and less heat is generated in the chuck 230 during operation of the exposure apparatus 10.

In FIG. 2A, the control system 224 includes (i) a Coulomb circuit 252 that selectively directs voltage to the Coulomb electrode assembly 246, and (ii) a J-R circuit 254 that selectively directs voltage to the J-R electrode assembly 248. In this embodiment, the Coulomb circuit 252 is electrically connected between the Coulomb electrode assembly 246 and the electrically conductive top 200A of the device 200, and includes a Coulomb voltage source 252A and a Coulomb switch 252B that can be controlled to selectively direct voltage to the Coulomb electrode assembly 246. Somewhat similarly, the J-R circuit 254 is electrically connected between the J-R electrode assembly 248 and the electrically conductive top 200A of the device 200, and includes a J-R voltage source 254A and a J-R switch 254B that can be used to selectively direct voltage to the J-R electrode assembly 248. The operation of the control system 224 is further discussed below.

Figure 2B:
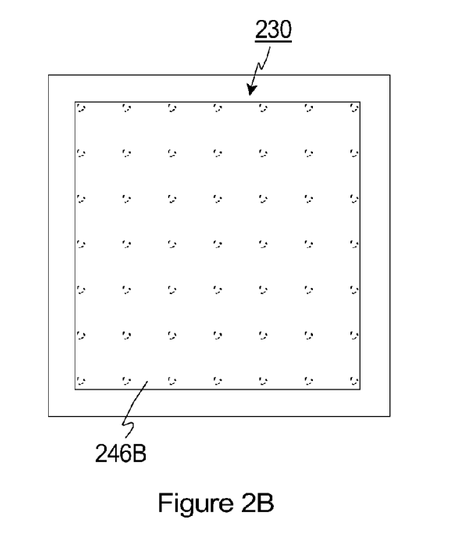
FIG. 2B is a simplified top view of the chuck of FIG. 2A.
Figure 2C:
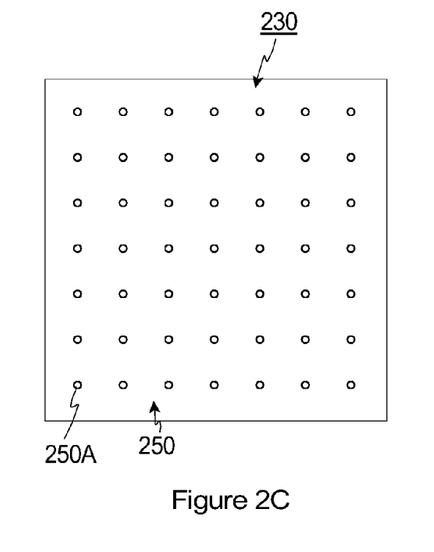
FIG. 2C is a simplified bottom view of the chuck of FIG. 2A.

FIG. 2B is a simplified top view and FIG. 2C is a simplified bottom view of the chuck 230. FIG. 2A illustrates that in this embodiment, the low resistivity channels 246B (illustrated in phantom) are equally spaced apart in the seven by seven rectangular matrix.

FIG. 2C illustrates that in this embodiment, the chuck 230 is a pin type chuck and the chucking surface 250 includes a plurality of spaced apart projections 250A ("pins"). The number and design of the projections 250A can be varied to suit the requirements of the chuck 230. For example, the projections 250A can have a cylindrical configuration. Further, in FIG. 2C, the chuck 230 includes forty-nine spaced apart projections 250A that are organized in a seven by seven rectangular matrix. In this embodiment, the number of projections 250A corresponds to the number of low resistivity channels 246B (illustrated in FIG. 2B). Alternatively, the chuck 230 can be design to include greater than forty-nine or fewer than forty-nine projections 250A, and/or the number of projections 250A can be different than the number of low resistivity channels 246B.

Figure 2D:
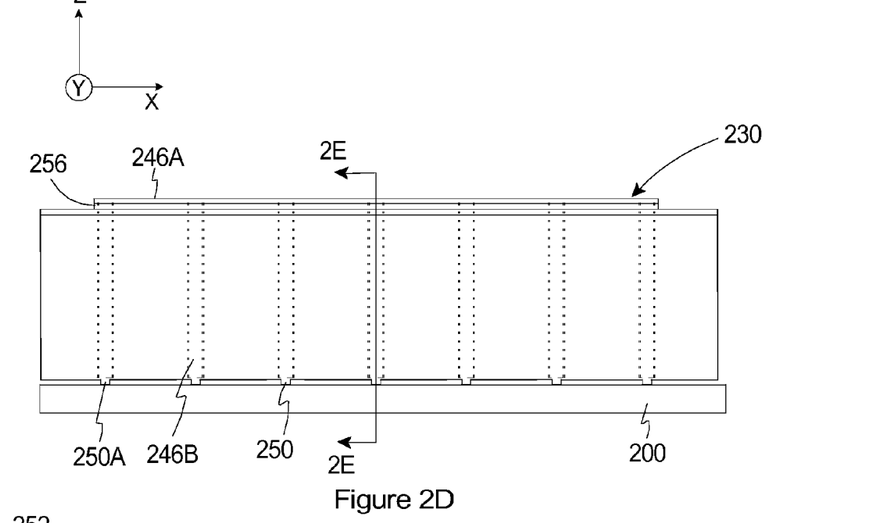
FIG. 2D is a simplified side view of the device and the chuck of FIG. 2A.
Figure 2E:
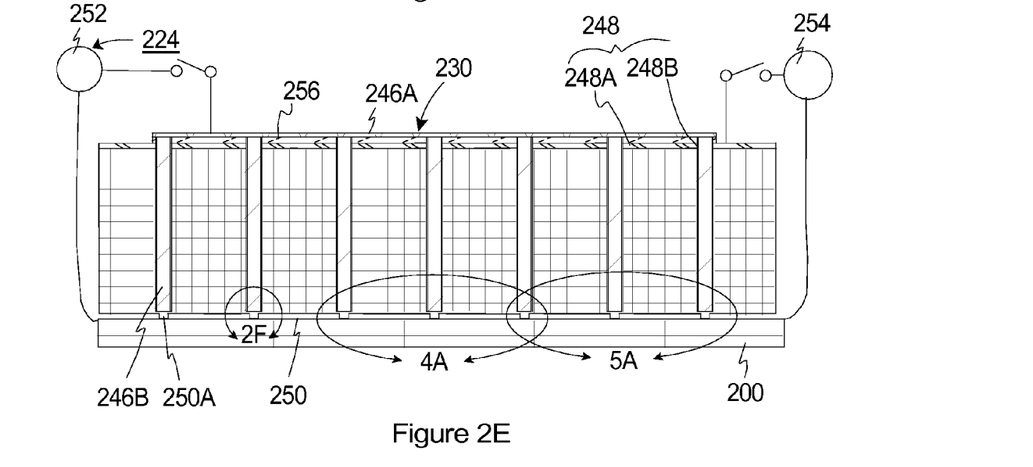
FIG. 2E is a simplified cut-away view of the device and the chuck taken on line 2E-2E in FIG. 2D, and a simplified illustration of a portion of the control system.
Figure 2F:
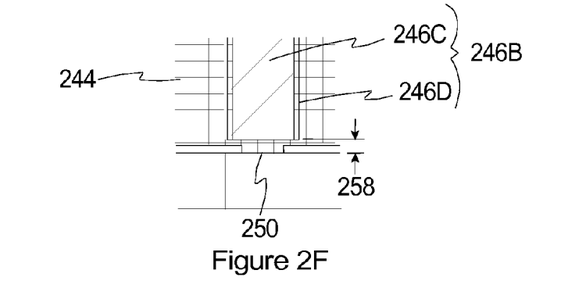
FIG. 2F is a enlarged view of a portion of the device and a portion of the chuck taken from line 2F in FIG. 2D.

FIG. 2D is a simplified side view of the device 200 and the chuck 230 of FIG. 2A; FIG. 2E is a simplified cut-away view of the device 200 and the chuck 230 taken on line 2E-2E in FIG. 2A, and a simplified illustration of a portion of the control system 224 including the Coulomb circuit 252 and the J-R circuit 254; and FIG. 2F is a enlarged view of a portion of the device 200 and a portion of the chuck 230 taken from line 2F in FIG. 2D.

FIGS. 2D and 2E illustrate that in this embodiment, an insulating plate 256 is positioned between the Coulomb electrode plate 246A and the J-R electrode plate 248. The insulting plate 256 electrically isolates the Coulomb electrode plate 246A and the J-R electrode plate 248 from each other. Suitable materials for the insulating plate 256 include alumina or low thermal expansion glass or Zerodur.

Further, FIG. 2E illustrates that the J-R electrode plate 248A includes a plurality of spaced apart plate apertures 248B that extend through the J-R electrode plate 248A and that allow the low resistivity channels 246B to extend through the J-R electrode plate 248A. In this embodiment, the J-R electrode plate 248A includes a separate plate aperture 248B for each low resistivity channel 246B. Thus, the J-R electrode plate 248A includes forty-nine spaced apart apertures 248B that are organized in a seven by seven rectangular matrix, and the number of apertures 248B corresponds to the number of low resistivity channels 246B.

Moreover, FIGS. 2D and 2E illustrate that the low resistivity channels 246B (i) cantilever downward from the Coulomb electrode plate 246A, and (ii) extend between the Coulomb electrode plate 246A and near the chucking surface 250.

Additionally, FIGS. 2D, 2E, and 2F illustrate the projections 250A engage the device 200 at a plurality of spaced apart locations.

FIG. 2F illustrates that a relatively narrow electrode gap 258 exists between the distal end of each low resistivity channel 246B and the chucking surface 250. In non-exclusive embodiments, the electrode gap 258 is less than approximately 200, 100, 50, 20, 10 or 5 microns. Because the relatively small electrode gap 258 separates the Coulomb electrode assembly 246 from the device 200, voltage directed to the Coulomb electrode plate 246A can generate a significant Coulomb type force.

Further, FIG. 2F illustrates that each low resistivity channel 246B includes a channel electrode 246C and a channel insulator 246D that insulates the channel electrode 246C from the J-R electrode assembly 248 (illustrated in FIG. 2E) and the majority of the high resistivity dielectric chuck body 244. In this embodiment, each channel electrode 246C is generally cylindrical shaped, and each channel insulator 246D is generally tubular shaped and encircles the channel electrode 246C. Alternatively, for example, each channel electrode 246C can have a generally rectangular shaped cross-section. To minimize any thermal stresses, small gaps should be maintained between the chuck body 244 and insulator 246D, and between the insulator 246D and the channel electrode 256C, unless the thermal expansion coefficients of all materials are exactly matched.

Suitable materials for the channel electrodes include electrically conductive materials such as chrome, copper, or gold or a liquid metal such as Ga or GaIn. The channel electrodes can also serve as thermal conductors, to remove heat from the interior of the chuck body. Suitable materials for the channel insulator 246D include alumina or low thermal expansion glass or Zerodur.

It should be noted that because of the unique design disclosed herein, the entire chucking surface 250 can be made of a uniform, homogenous material. Stated in another fashion, the present design allows for the chucking surface 250 to be substantially uniform in composition. This allows for the chucking surface 250 to be made in a more accurate fashion, and the chucking surface 250 to be made exceptionally flat.

Further, with the present design, the entire areas of the projections 250A can be used to generate the J-R type force. This allows the J-R force to hold the device 200 with improved flatness.

In another embodiment, the channel insulator 246D can be extended between the distal end of the channel electrode 246B and the chuck material lying within the gap 258. The channel electrode 246B is then electrically insulated from the chuck body 244, and voltage applied to the channel electrode 246B will not cause current to flow through the chuck body. Thus ohmic heating of the chuck body is avoided when voltage is applied to the Coulomb electrode plate 246A. In this embodiment, voltage to the Coulomb electrode plate 246A could be maintained during exposure if desired.

The operation of the control system 224 regarding the adjustment of Coulomb switch 252B and J-R switch 254B will now be explained using FIGS. 3A-3E. While one particular embodiment of the chuck 330 is shown, and is discussed later in connection with FIG. 9, the control system 224 operation is substantially the same for other embodiments. In FIGS. 3A-3E, each switch 252B, 254B is illustrated as including three alternative positions, labeled P1, P2, and P3.

Figure 3A:
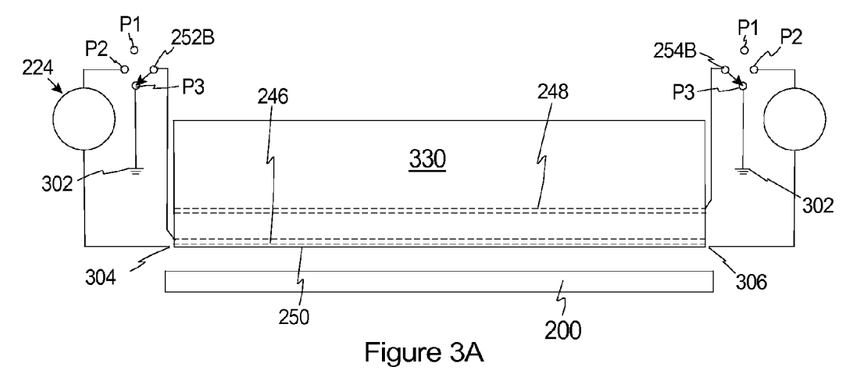
FIGS. 3A-3E are simplified views of a chuck embodiment which illustrate the use of switches to control the electrical potential of the device, the Coulomb electrode assembly and the J-R electrode assembly during the load, chucking, exposure, chuck release and unload cycle of the device.
Figure 3B:
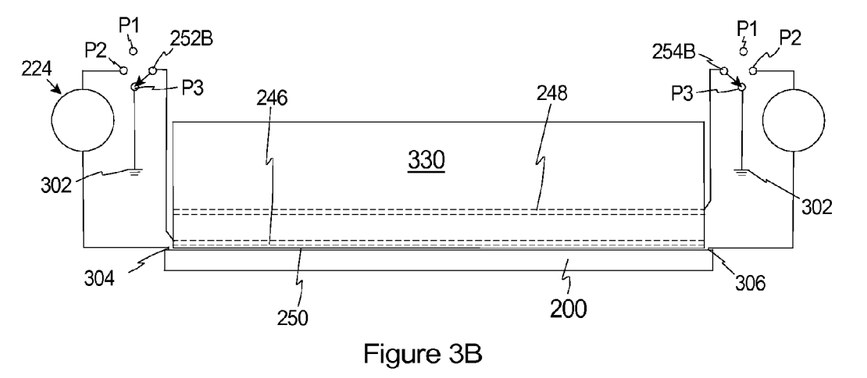

FIGS. 3A and 3B illustrate the initial loading of the device 200. A loader mechanism (not shown) raises the device 200 against the chucking surface 250 of the chuck 330. The Coulomb switch 252B is set to position P3, and the J-R switch 254B is set to position P3. For each switch 252B, 254B, in this embodiment, P3 is connected to ground 302. Accordingly, switch position P3 for the Coulomb switch 252B electrically connects the Coulomb electrode assembly 246 to ground 302, and switch position P3 for the J-R switch 254B electrically connects the J-R electrode assembly 248 to ground 302. Electrical ground 302 may be at earth potential or it may be at some other potential. In FIG. 3A the device 200 is maintained at the same potential as the electrical ground 302 prior to loading, so when the device 200 contacts a Coulomb electrical connection 304 and a J-R electrical connection 304 in FIG. 3B, all entities are at the same electrical potential, and no current flows. If voltage differences occurred, creating current surges, damage to device 200 could result.

Figure 3C:
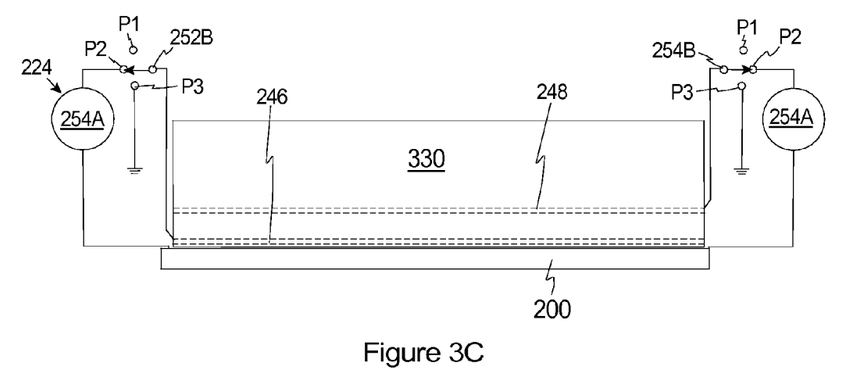

In FIG. 3C the control system 224 sets the Coulomb switch 252B to position P2, and the J-R switch 254B to position P2, thereby directing voltage from the Coulomb voltage source 252A to Coulomb electrode assembly 246, and from the J-R voltage source 254A to the J-R electrode assembly 248. In some embodiments control system 224 directs voltage to Coulomb electrode assembly 246 before directing voltage to J-R electrode assembly 248. At this point chucking of device 200 is complete, and exposure can begin.

Figure 3D:
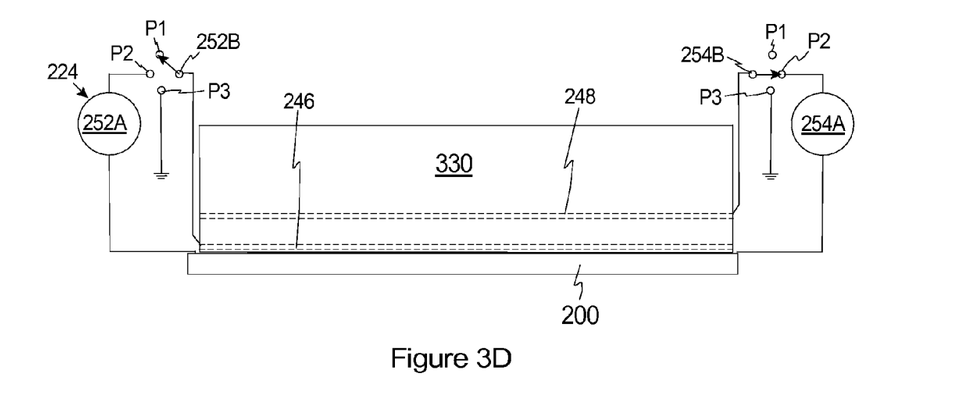

FIG. 3D illustrates another embodiment, where Coulomb switch 252B is set to position P1, which opens the electrical circuit and allows Coulomb electrode assembly 246 to float to the local voltage level in the chuck. In some cases, the control system 224 may adjust the Coulomb voltage source 252A to approximately the local voltage level in the chuck before changing Coulomb switch 252B from position P2 to P1. At this point chucking of device 200 is complete, and exposure begins.

Figure 3E:
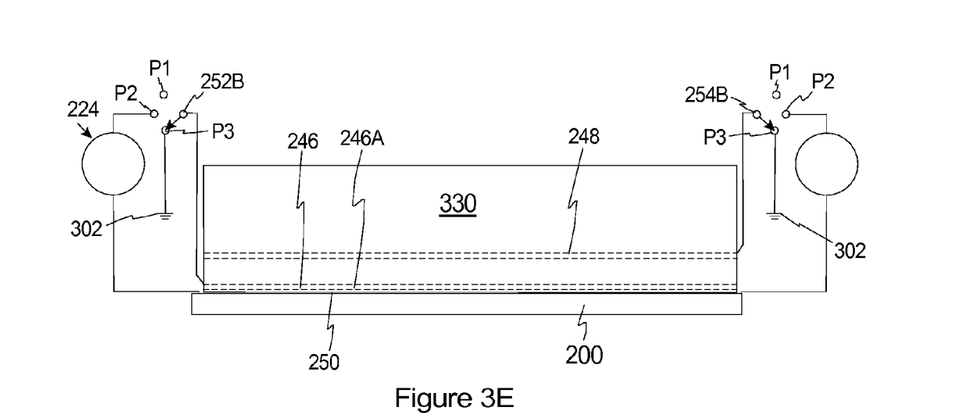

When exposures with device 200 are completed, the unload process is initiated as illustrated in reference to FIGS. 3D and 3E. The loader mechanism is introduced to support the device 200 in position, while the chuck is releasing the device 200. Control system 224 adjusts J-R voltage source 254A to the potential of electrical ground 302 in FIG. 3D and sets Coulomb switch 252B to position P3 in FIG. 3E; and subsequently, the control system 224 sets J-R switch 254B to position P3.

The release time is basically determined by the time required for electrical charge located near the chucking surface 250 to drain away. The proximity of the Coulomb electrode plate 246A to the device 200 reduces the resistance in the discharge path and reduces the release time, compared to the case of a conventional J-R chuck, where discharge involves the more distant J-R electrode 248. Progress of the discharge may be monitored with a current meter (not shown).

When discharge is complete, the device 200 is removed with the loader mechanism.

While Coulomb switch 252B and J-R switch 254B are shown as three position switches in FIGS. 3A-3E, their functions could be provided by a number of separate switches as well. In certain embodiments, during the normal operation of the chuck 330, the position P1 of J-R switch 254B is not used.

Figure 4A:
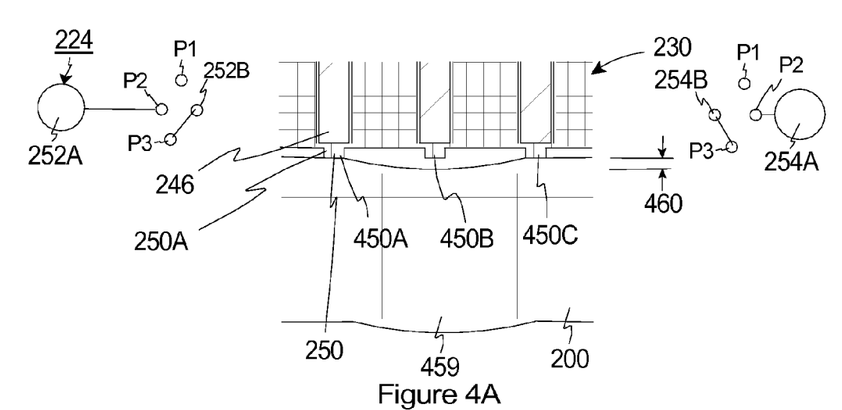
FIG. 4A is a simplified, enlarged view of a portion of the device and a portion of the chuck taken from line 4A in FIG. 2E after activation of a J-R electrode assembly of the chuck and a simplified illustration of a portion of the control system.

The benefits and features of the present invention are further explained with reference to FIGS. 4A-5C. In particular, FIG. 4A is a simplified, enlarged view of a portion of the device 200 and a portion of the chuck 230 taken from line 4A in FIG. 2E before the activation of the electrode assemblies 246, 248 (illustrated in FIG. 2A) of the chuck 230, and a simplified illustration of a portion of the control system 224. At this time, for illustration purposes, the control system 224 (i) has set the J-R switch 254B to position P3 so that the J-R electrode assembly 248 is connected to electrical ground 302 (illustrated in FIG. 3A), and (ii) has set the Coulomb switch 252B to position P3 so that the Coulomb electrode assembly 246 is connected to electrical ground 302 (illustrated in FIG. 3A). During this condition, the device 200 is pressed against the chuck surface by a mechanical device loader mechanism, which is not shown.

FIG. 4A illustrates that this particular portion of the device 200 is not flat and includes a curved region 459. As a result thereof, there is a non-contact gap 460 between the device 200 and the chucking surface 250. More specifically, in FIG. 4A, three projections 250A are illustrated. In this example, the projections 250A are labeled 450A, 450B, and 450C for ease of discussion. Further, because of the non-flatness of the device 200, only the projections labeled 450A and 450C are contacting the device 200 and the non-contact gap 460 exists between the projection labeled 450B and the device 200.

It should be noted that the generation of J-R forces is largely dependent upon direct physical contact between the chucking surface 250 and the device 200. For example, when voltage is directed to the J-R electrode assembly 248 (illustrated in FIG. 2A), strong J-R forces are generated at the areas where the chucking surface 250 directly contacts and engages the device 200, while very weak to no J-R forces are generated at the areas where the chucking surface 250 does not directly contact the device 200. In the example illustrated in FIG. 3A, (i) very strong J-R forces will be generated at projections labeled 450A and 450C that directly contact the device 200, when J-R switch 254B is set to position P2, and (ii) very weak to zero J-R forces will be generated at the projection labeled 450B because this projection 450B does not directly contact the device 200. Because, weak to zero J-R forces are generated at the projection labeled 450B, the use of only J-R forces may not be sufficient to eliminate or reduce the curved region 459 and fully flatten the device 200. Stated in another fashion, the J-R forces alone may not be effective in pulling non-contacting regions together to improve flatness.

Figure 4B:
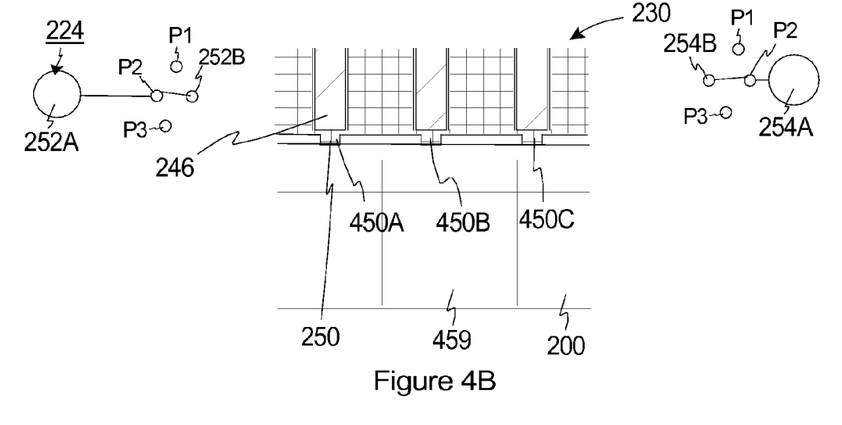
FIG. 4B is a simplified, enlarged view of the portion of the device and the portion of the chuck from FIG. 4A after activation of a Coulomb electrode assembly in addition to the activation of J-R electrode assembly of the chuck, and a simplified illustration of a portion of the control system.

FIG. 4B is a simplified, enlarged view of a portion of the device 200 and a portion of the chuck 230 from FIG. 4A after activation of both the Coulomb electrode assembly 246 and the J-R electrode assembly 248 (illustrated in FIG. 2A) of the chuck 230, and a simplified illustration of a portion of the control system 224. At this time, for illustration purposes, the control system 224 (i) has set J-R switch 254B to position P2 so that the J-R voltage source 254A is directing voltage to the J-R electrode assembly 248 (illustrated in FIG. 2A), and (ii) has set the Coulomb switch 252B to position P2 so that the Coulomb voltage source 252A is directing voltage to the Coulomb electrode assembly 246.

It should be noted that in certain embodiments it may be desirable to direct voltage to the Coulomb electrode assembly 246 prior to directing voltage to the J-R electrode assembly 248. This can be done by selectively controlling the switches 252B, 254B. As provided herein, a device such as a reticle is typically not exactly flat when it is loaded onto the chuck 230. Thus, when it is pulled flat with the chuck 230 disclosed herein, it is often necessary for the reticle to slide a little relative to the projections. During the flattening process, the J-R force may inhibit sliding of the reticle relative to projections in contact with the reticle. Accordingly, as provided herein, it can be beneficial to start with the relatively long range and relatively weaker Coulomb force. After, the Coulomb force has flattened the reticle, the J-R force can be applied to further flatten and hold the reticle in position.

FIG. 4B illustrates that the application of both the J-R force and the Coulomb force has flattened the curved region 459 and the flatness of the device 200 has been significantly improved. As a result thereof, there is no longer a non-contact gap 460 (illustrated in FIG. 4A) between the device 200 and the chucking surface 250. More specifically, in FIG. 4B, the projections labeled 450A, 450B, and 450C are all now in direct contact with the device 200.

It should be noted that Coulomb forces are virtually unaffected in the presence of small gaps between the chucking surface 250 and the device 200. Thus, the non-contact gap 460 from FIG. 4A between the projection labeled 450B and the device 200 does not influence the magnitude of the Coulomb forces that are being generated at the projection labeled 450B. As a result thereof, the Coulomb forces can be used to pull the device 200 to the projection labeled 450B and flatten the curved region 459 of the device 200.

Further, it should be noted that each projection 450A, 450B, 450C is capable of generating both the J-R force and the Coulomb force. Thus, there are no wasted areas on the chucking surface 250.

Figure 4C:
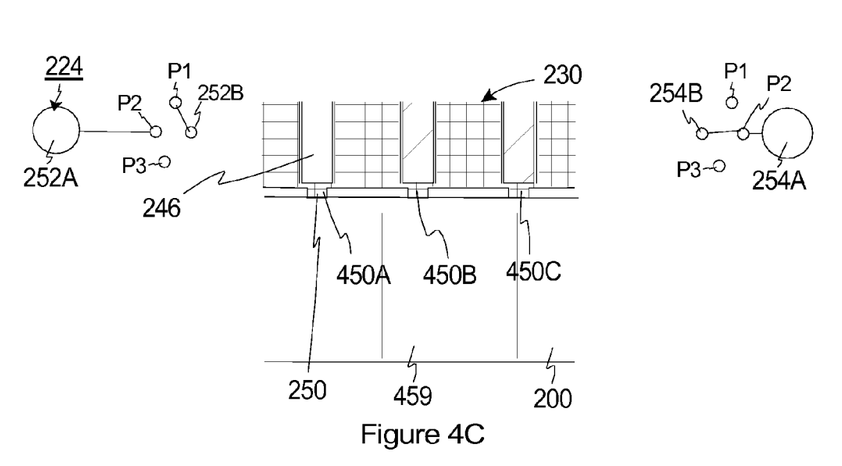
FIG. 4C is a simplified, enlarged view of the portion of the device and the portion of the chuck taken from FIG. 4B while the J-R electrode assembly is still activated and after the Coulomb electrode assembly has been deactivated, and a simplified illustration of a portion of the control system.

FIG. 4C is a simplified, enlarged view of a portion of the device 200 and a portion of the chuck 230 from FIG. 4B after deactivation of the Coulomb electrode assembly 246 and while the J-R electrode assembly 248 (illustrated in FIG. 2A) is still activated by the control system 224. At this time, for illustration purposes, the control system 224 (i) has maintained the J-R switch 254B at position P2 so that the J-R voltage source 254A is directing voltage to the J-R electrode assembly 248 (illustrated in FIG. 2A), and (ii) has set the Coulomb switch 252B to position P1 so that the Coulomb voltage source 252A is not directing voltage to the Coulomb electrode assembly 246.

FIG. 4C illustrates that the application of just the J-R force is sufficient to maintain the flatness of the curved region 459 against the projection labeled 450B and the flatness of the device 200. As a result thereof, there is still no longer a non-contact gap 460 (illustrated in FIG. 4A) between the device 200 and the chucking surface 250. More specifically, in FIG. 4C, the projections labeled 450A, 450B, and 450C are all now in direct contact with the device 200.

As provided above, the generation of J-R forces is largely dependent upon physical contact between the chucking surface 250 and the device 200. Thus, after the projection labeled 450B has been brought into direct physical contact with the device 200, a very strong J-R force is now generated at the projection labeled 450B and the device 200 to maintain the flattened curved region 459. Thus, at this time, it is no longer necessary to direct voltage to the Coulomb electrode assembly 246.

With this design, the control system 224 directs voltage to both the Coulomb electrode assembly 246 and the J-R electrode assembly 248 to flatten the device 200 during initial chucking of the device 200. Subsequently, the Coulomb electrode assembly 246 can be deactivated during the operation of the exposure apparatus 10 (illustrated in FIG. 1).

Figure 5A:
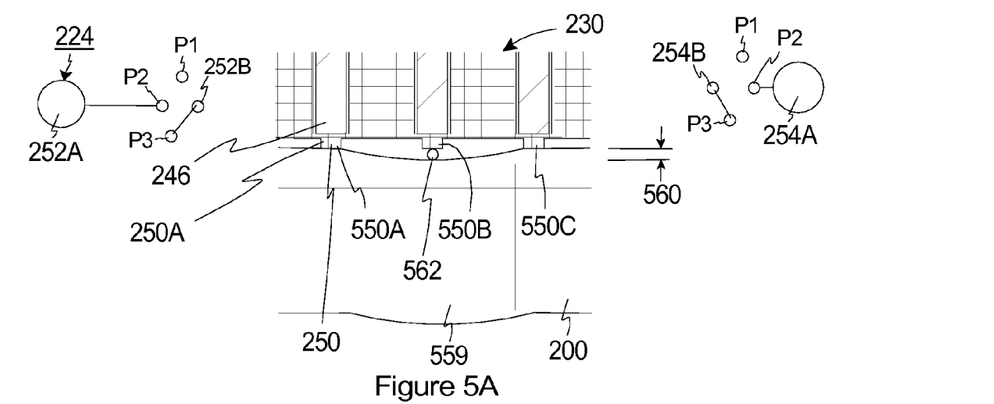
FIG. 5A is another simplified, enlarged view of a portion of the device and a portion of the chuck taken from line 5A in FIG. 2E after activation of the J-R electrode assembly of the chuck, and a simplified illustration of a portion of the control system.

FIG. 5A is a simplified, enlarged view of a portion of the device 200 and a portion of the chuck 230 taken from line 5A in FIG. 2E before activation of the electrode assemblies 246, 248 (illustrated in FIG. 2A) of the chuck 230, and a simplified illustration of a portion of the control system 224. At this time, for illustration purposes, the control system 224 (i) has set the J-R switch 254B to position P3 so that the J-R electrode assembly 248 is connected to electrical ground 302 (illustrated in FIG. 3A), and (ii) has set the Coulomb switch 252B to position P3 so that the Coulomb electrode assembly 246 is connected to electrical ground 302. During this condition, the device 200 is pressed against the chuck surface by a mechanical device loader mechanism, which is not shown.

FIG. 5A illustrates that a particle 562 is positioned between a portion of the device 200 and the chucking surface 250. The particle 562 causes the device 200 to not be flat and device 200 includes a curved region 559. Further, as a result thereof, there is a non-contact gap 560 between the device 200 and the chucking surface 250. More specifically, in FIG. 5A, three projections 250A are illustrated. In this example, the projections 250A are labeled 550A, 550B, and 550C for ease of discussion. Further, because of the particle 562, only the projections labeled 550A and 550C are contacting the device 200 and the non-contact gap 560 exists between the projection labeled 550B and the device 200.

As provided above, the generation of J-R forces is largely dependent upon direct physical contact between the chucking surface 250 and the device 200. Thus, only a very weak to no J-R forces would be generated at the projection labeled 550B because this projection 550B does not directly contact the device 200. Because weak to zero J-R forces are generated at the projection labeled 550B, the use of only J-R forces may not be sufficient to crush the particle 562 and fully flatten the device 200. Stated in another fashion, the J-R forces alone may be ineffective in pulling non-contacting regions together to improve flatness, as well as crushing and/or embedding particles.

Figure 5B:
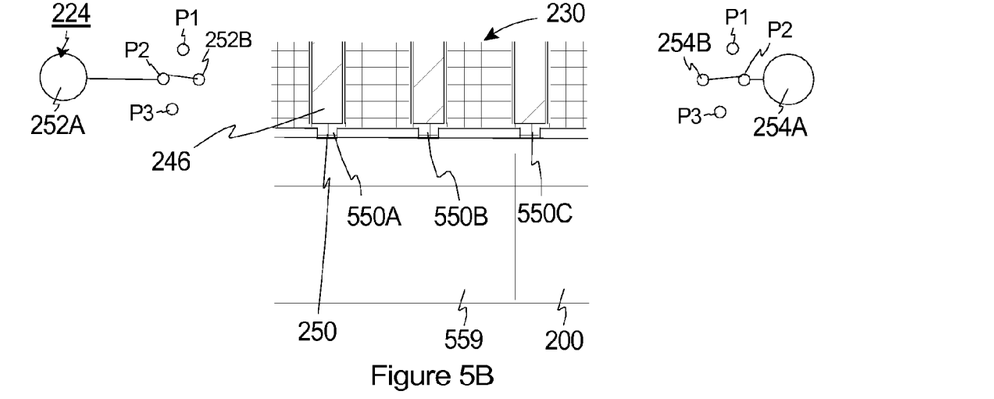
FIG. 5B is a simplified, enlarged view of the portion of the device and the portion of the chuck of FIG. 5A after activation of the Coulomb electrode assembly in addition to the activation of J-R electrode assembly of the chuck, and a simplified illustration of a portion of the control system.

FIG. 5B is a simplified, enlarged view of a portion of the device 200 and a portion of the chuck 230 from FIG. 5A after activation of both the Coulomb electrode assembly 246 and the J-R electrode assembly 248 (illustrated in FIG. 2A) of the chuck 230, and a simplified illustration of a portion of the control system 224. At this time, for illustration purposes, the control system 224 (i) has set J-R switch 254B to position P2 so that the J-R voltage source 254A is directing voltage to the J-R electrode assembly 248 (illustrated in FIG. 2A), and (ii) has set the Coulomb switch 252B to position P2 so that the Coulomb voltage source 252A is directing voltage to the Coulomb electrode assembly 246.

FIG. 5B illustrates that the application of both the J-R force and the Coulomb force has caused the chuck 230 to crush and/or embed the particle 562, flatten the curved region 559, and improve the flatness of the device 200. As a result thereof, there is no longer a non-contact gap 560 (illustrated in FIG. 5A) between the device 200 and the chucking surface 250. More specifically, in FIG. 5B, the projections labeled 550A, 550B, and 550C are all now in direct contact with the device 200.

As provided above, the Coulomb forces are virtually unaffected in the presence of small gaps between the chucking surface 250 and the device 200. Thus, the non-contact gap 560 from FIG. 5A between the projection labeled 550B and the device 200 does not influence the magnitude of the Coulomb forces that are being generated at the projection labeled 550B. As a result thereof, the Coulomb forces can be used to crush and/or embed the particle 562.

Figure 5C:
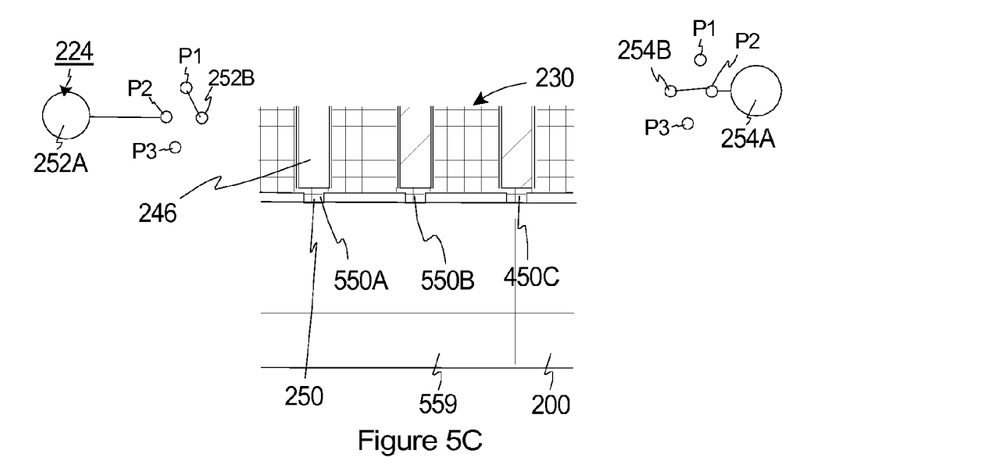
FIG. 5C is a simplified, enlarged view of the portion of the device and the portion of the chuck of FIG. 5B while the J-R electrode assembly is still activated and after the Coulomb electrode assembly has been deactivated, and a simplified illustration of a portion of the control system.

FIG. 5C is a simplified, enlarged view of a portion of the device 200 and a portion of the chuck 230 from FIG. 5B after deactivation of the Coulomb electrode assembly 246 and while the J-R electrode assembly 248 (illustrated in FIG. 2A) is still activated by the control system 224. At this time, for illustration purposes, the control system 224 (i) has maintained the J-R switch 254B at position P2 so that the J-R voltage source 254A is directing voltage to the J-R electrode assembly 248 (illustrated in FIG. 2A), and (ii) has set the Coulomb switch 252B to position P1 so that the Coulomb voltage source 252A is not directing voltage to the Coulomb electrode assembly 246.

In FIG. 5A, the size of the particle has been greatly exaggerated for the purpose of illustration. In reality particles are typically very small compared to the dimensions of projections 550B. Consequently when the particle is crushed or embedded, a significant fraction of the chucking surface associated with projection 550B is in direct contact with the device 200, so the J-R force can be quite strong. For this reason, the Coulomb force does not have to completely crush and/or embed the particle before the J-R force can become effective. The Coulomb force need only bring some fraction of the chucking surface associated with projection 550B into contact with device 200, so that the J-R force can become effective.

FIG. 5C illustrates that the application of just the J-R force is sufficient to maintain the flatness of the curved region 559 against the projection labeled 550B and the flatness of the device 200. As a result thereof, there is still no longer a non-contact gap 560 (illustrated in FIG. 5A) between the device 200 and the chucking surface 250. More specifically, in FIG. 5C, the projections labeled 550A, 550B, and 550C are all now in direct contact with the device 200.

As provided above, the generation of J-R forces is largely dependent upon physical contact between the chucking surface 250 and the device 200. Thus, after the projection labeled 550B has been brought into direct physical contact with the device 200, a very strong J-R force is now generated at the projection labeled 550B and the device 200. Thus, at this time, it is no longer necessary to direct voltage to the Coulomb electrode assembly 246.

With this design, the control system 224 directs voltage to both the Coulomb electrode assembly 246 and the J-R electrode assembly 248 to flatten the device 200 during initial chucking of the device 200. Subsequently, the Coulomb electrode assembly 246 can be deactivated during the operation of the exposure apparatus 10 (illustrated in FIG. 1)

Figure 6:
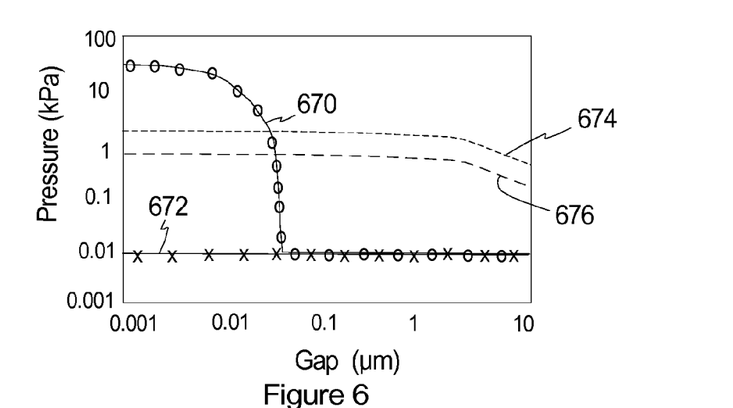
FIG. 6 is a graph that illustrates the pressure versus a non-contact gap for J-R electrode assembly and the Coulomb electrode assembly.

FIG. 6 is a graph that illustrates one non-exclusive embodiment of the pressure generated versus gap for J-R electrode assembly 248 and the Coulomb electrode assembly 246 of FIG. 2A. In this embodiment, (i) line 670 (solid with "o's") represents the J-R force generated at a projection; (ii) line 672 (solid with "x's") represents the J-R force generated between projections; (iii) line 674 (short dashes) represents the Coulomb force generated at a projection; and (iv) line 676 (long dashes) represents the Coulomb force generated between the projections. This graph illustrates that (i) the J-R force generated at the projection is very high when there is contact and decreases rapidly as the gap increases until the gap reaches a certain amount, (ii) the Coulomb force generated at the projection is relatively constant as the gap increases, (iii) the Coulomb force generated between projections is also relatively constant as the gap increases, (iv) the J-R force generated at the projection is greater than the Coulomb force generated at the projection when the gap is relatively small.

Figure 7A:
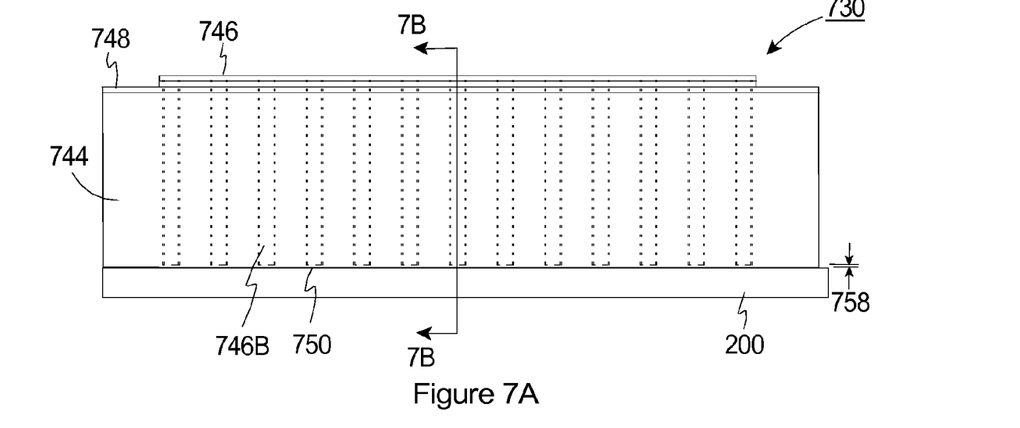
FIG. 7A is a simplified side view of the device and another embodiment of the chuck.
Figure 7B:
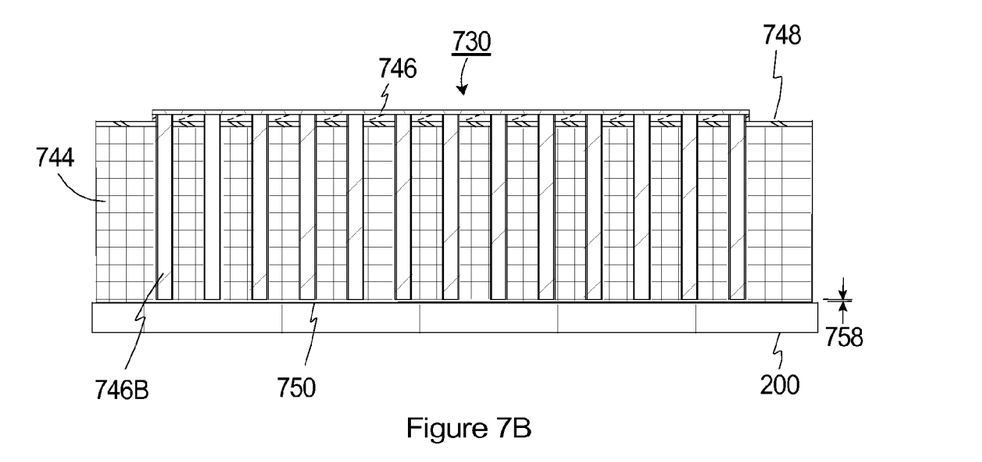
FIG. 7B is a simplified cut-away view of the device and chuck of FIG. 7A.

FIG. 7A is a simplified side view of the device 200 and another embodiment of the chuck 730 and FIG. 7B is a simplified cut-away view of the device 200 and the chuck 730 of FIG. 7A. In this embodiment, the chuck 730 includes a Coulomb electrode assembly 746 and a J-R electrode assembly 748 that are similar to the corresponding components described above and illustrated in FIG. 2A. However, in this embodiment, the chucking surface 750 of the chuck body 744 is flat and does not include any projections. Thus, it is important that the chucking surface 750 be made extremely flat. As described above, the chucking surface 750 of the present invention is made of a uniform composition. This feature makes it easier to make an extremely flat chucking surface 750.

Further, FIGS. 7A and 7B illustrate that an electrode gap 758 exists between each low resistivity channel 746B and the chucking surface 750.

In this embodiment, the entire chucking surface 750 can be used to generate the J-R force, while the Coulomb force is restricted to the regions of the low resistivity channels 746B.

Figure 8:
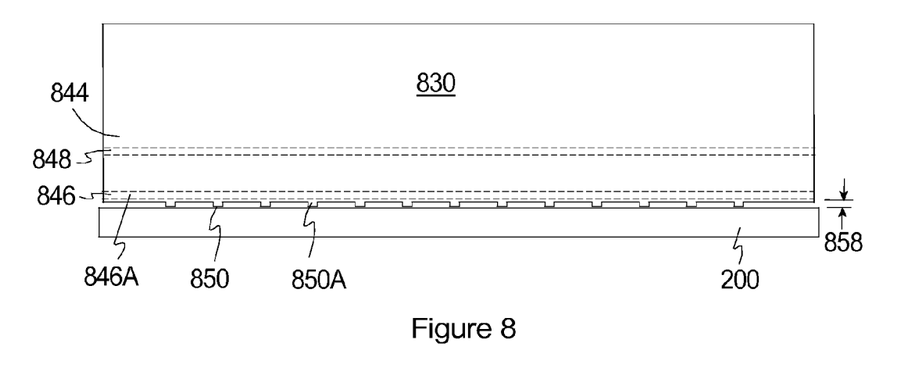
FIG. 8 is a simplified side view of the device and another embodiment of the chuck.

FIG. 8 is a simplified side view of the device 200 and another embodiment of the chuck 830. In this embodiment, the chuck 830 includes a chuck body 844 having a chucking surface 850 that includes plurality of projections 850A similar to the chuck body 244 illustrated in FIG. 2A. Further, the chuck 830 includes a Coulomb electrode assembly 846 that is electrically connected to the Coulomb circuit 252 (illustrated in FIG. 2A) and a J-R electrode assembly 848 that is electrically connected to the J-R circuit 254 (illustrated in FIG. 2A). However, in this embodiment, the Coulomb electrode assembly 846 only includes the Coulomb electrode plate 846A (disposed within the chuck body 844) that is positioned very close to and spaced apart the electrode gap 858 from the chucking surface 850. Moreover, in this embodiment, the J-R electrode assembly 848 is disposed within the chuck body 844. Further, the Coulomb electrode assembly 846 is closer to the chucking surface 850 than the J-R electrode assembly 848.

In this embodiment, the entire Coulomb electrode plate 846A can be used to generate the Coulomb force, while the J-R force is mainly restricted to the regions of the projections 850A.

Figure 9:
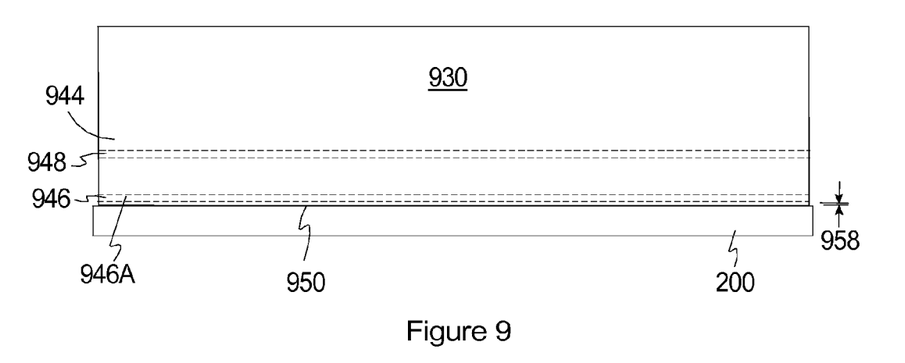
FIG. 9 is a simplified side view of the device and yet another embodiment of the chuck.

FIG. 9 is a simplified side view of the device 200 and another embodiment of the chuck 930. In this embodiment, the Coulomb electrode assembly 946 and the J-R electrode assembly 948 are similar to the corresponding components described above and illustrated in FIG. 8. However, in this embodiment, the chucking surface 950 of the chuck body 944 is flat and does not include the plurality of projections.

Further, FIG. 9 illustrates that an electrode gap 958 exists between the Coulomb electrode plate 946A and the chucking surface 950.

In this embodiment, the entire chucking surface 950 can be used to generate the Coulomb force and the J-R force.

Figure 10:
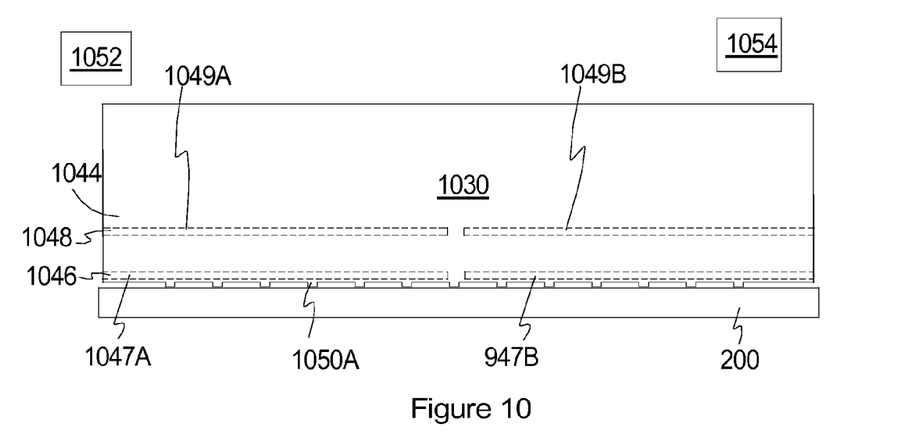
FIG. 10 is a simplified side view of the device and still another embodiment of the chuck.

FIG. 10 is a simplified side view of the device 200 and still another embodiment of the chuck 1030 that is similar to the chuck 830 illustrated in FIG. 8 and described above. In this embodiment, the chuck 1030 includes a chuck body 1044 having a chucking surface 1050 that includes plurality of projections 1050A similar to the chuck body 844 illustrated in FIG. 8. Further, the chuck 1030 includes a Coulomb electrode assembly 1046 that is electrically connected to the Coulomb circuit 1052 (illustrated as a box) and a J-R electrode assembly 1048 that is electrically connected to the J-R circuit 1054 (illustrated as a box). However, in this embodiment, the chuck 1030 is a bipolar chuck, and voltages of opposite polarity are applied to adjacent electrodes in the chuck 1030. More specifically, in this embodiment, (i) the Coulomb electrode assembly 1046 includes a first Coulomb electrode 1047A and a second Coulomb electrode 1047B that is space apart from the first Coulomb electrode 1047A, (ii) the Coulomb circuit 1052 directs a voltage to the Coulomb electrodes 1047A, 1047B so that one of the Coulomb electrodes 1047A, 1047B has a positive charge, and the other one of the Coulomb electrodes 1047A, 1047B has a negative charge, (iii) the J-R electrode assembly 1048 includes a first J-R electrode 1049A and a second J-R electrode 1049B that is space apart from the first J-R electrode 1049A, and (iv) the J-R circuit 1054 directs a voltage to the J-R electrodes 1049A, 1049B so that one of the J-R electrodes 1049A, 1049B has a positive charge, and the other one of the J-R electrodes 1049A, 1049B has a negative charge. The voltages are typically determined so that the device 200 voltage is close to electrical ground 302.

While the particular chuck 30 and method as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. An electrostatic chuck for holding a device, the electrostatic chuck comprising:
    a chuck body including a chucking surface that engages the device, the chucking surface being made of a dielectric having a high resistance, the chucking surface being substantially uniform in composition; wherein substantially the entire chucking surface has a substantially uniform resistivity;
    a J-R electrode assembly positioned spaced apart from the chucking surface;
    a Coulomb electrode assembly positioned spaced apart from the chucking surface; and
    a control system that selectively directs a first voltage to the J-R electrode assembly to generate a J-R type force that attracts the device towards the chucking surface, and selectively directs a second voltage to the Coulomb electrode assembly to generate a Coulomb type force that attracts the device towards the chucking surface.

2. The electrostatic chuck of claim 1 wherein the chucking surface is flat.

3. The electrostatic chuck of claim 1 wherein the chucking surface includes plurality of projections.

4. An exposure apparatus comprising: an illumination source and the electrostatic chuck of claim 1 that retains the device.

5. The exposure apparatus of claim 4 wherein the electrostatic chuck retains a reticle.

6. An exposure apparatus for transferring an image from a reticle to a wafer, the image apparatus comprising:
    an illumination source that selectively directs a beam at the reticle; and
    an electrostatic chuck that retains the reticle, the electrostatic chuck including (i) a chuck body having a chucking surface that engages the device, (ii) a J-R electrode assembly positioned spaced apart from the chucking surface, (iii) a Coulomb electrode assembly positioned spaced apart from the chucking surface an electrode gap, the Coulomb electrode assembly being closer to the chucking surface than the J-R electrode assembly, and (iv) a control system that selectively directs a first voltage to the J-R electrode assembly to generate a J-R type force that attracts the device towards the chucking surface, and selectively directs a second voltage to the Coulomb electrode assembly to generate a Coulomb type force that attracts the device towards the chucking surface.

7. The exposure apparatus of claim 6 wherein the chucking surface is substantially uniform in composition.

8. The exposure apparatus of claim 6 wherein an electrode gap separates the Coulomb electrode assembly from the chucking surface, and the electrode gap is less than approximately one hundred microns.

9. The exposure apparatus of claim 6 wherein the control system directs the first voltage the first voltage to the J-R electrode assembly and the second voltage to the Coulomb electrode assembly during initial chucking of the reticle, and subsequently, the control system does not direct the second voltage to the Coulomb electrode assembly when the illumination source is directing the beam at the reticle.

10. A method for holding a device, the method comprising the steps of:
    providing a chuck body including a chucking surface that engages the device, the chucking surface being made of a dielectric having a high resistance, the chucking surface being substantially uniform in composition; wherein substantially the entire chucking surface has a substantially uniform resistivity;
    positioning a J-R electrode assembly spaced apart from the chucking surface;
    positioning a Coulomb electrode assembly spaced apart from the chucking surface an electrode gap;
    selectively directing a first voltage to the J-R electrode assembly with a control system to generate a J-R type force that attracts the device towards the chucking surface; and
    selectively directing a second voltage to the Coulomb electrode assembly to generate a Coulomb type force that attracts the device towards the chucking surface.

11. The method of claim 10 further comprising the step of subsequently discontinuing the second voltage to the Coulomb electrode assembly while continuing to direct the first voltage to the J-R electrode assembly.

12. A method for making an exposure apparatus comprising the steps of providing an illumination source, providing a reticle, and holding the reticle by the method of claim 10.

13. A method of making a wafer including the steps of providing a substrate and forming an image on the substrate with the exposure apparatus made by the method of claim 12.

14. An electrostatic chuck for holding a device, the electrostatic chuck comprising:
   a chuck body including a chucking surface that engages the device, the chucking surface being made of a dielectric having a relatively high resistance;
   a J-R electrode assembly positioned spaced apart from the chucking surface;
   a Coulomb electrode assembly positioned spaced apart from the chucking surface, the Coulomb electrode assembly being closer to the chucking surface than the J-R electrode assembly; and
   a control system that selectively directs a first voltage to the J-R electrode assembly to generate a J-R type force that attracts the device towards the chucking surface, and selectively directs a second voltage to the Coulomb electrode assembly to generate a Coulomb type force that attracts the device towards the chucking surface.

15. The electrostatic chuck of claim 14 wherein an electrode gap separates the Coulomb electrode assembly from the chucking surface, and the electrode gap is less than approximately one hundred microns.

16. An exposure apparatus comprising:
   an illumination source; and
   an electrostatic chuck that retains a device, the electrostatic chuck comprising:
   a chuck body including a chucking surface that engages the device, the chucking surface being made of a dielectric having a relatively high resistance;
   a J-R electrode assembly positioned spaced apart from the chucking surface;
   a Coulomb electrode assembly positioned spaced apart from the chucking surface; and
   a control system that selectively directs a first voltage to the J-R electrode assembly to generate a J-R type force that attracts the device towards the chucking surface, and selectively directs a second voltage to the Coulomb electrode assembly to generate a Coulomb type force that attracts the device towards the chucking surface, the control system directing the first voltage to the J-R electrode assembly and the second voltage to the Coulomb electrode assembly during initial chucking of the device, and subsequently, the control system not directing the second voltage to the Coulomb electrode assembly during operation of the illumination source.

17. The exposure apparatus of claim 16 wherein the electrostatic chuck retains a reticle.

18. A method for holding a device, the method comprising the steps of:
   providing a chuck body including a chucking surface that engages the device, the chucking surface being made of a dielectric having a relatively high resistance;
   positioning a J-R electrode assembly spaced apart from the chucking surface;
   positioning a Coulomb electrode assembly spaced apart from the chucking surface an electrode gap, the Coulomb electrode assembly being closer to the chucking surface than the J-R electrode assembly;
   selectively directing a first voltage to the J-R electrode assembly with a control system to generate a J-R type force that attracts the device towards the chucking surface; and
   selectively directing a second voltage to the Coulomb electrode assembly to generate a Coulomb type force that attracts the device towards the chucking surface.

\* \* \* \* \*